United States Patent
Arkin

[11] Patent Number: 5,923,197
[45] Date of Patent: Jul. 13, 1999

[54] PULSE STUFFING CIRCUIT FOR PROGRAMMABLE DELAY LINE

[75] Inventor: Brian J. Arkin, Pleasanton, Calif.

[73] Assignee: Credence Systems Corporation, Fremont, Calif.

[21] Appl. No.: 08/905,066

[22] Filed: Jul. 31, 1997

[51] Int. Cl.[6] .................................................. H03K 5/13
[52] U.S. Cl. ........................ 327/262; 327/263; 327/284
[58] Field of Search ................................. 327/262, 263, 327/264, 265, 261, 273, 279, 284, 285, 286, 362, 232, 276, 277; 377/50, 43

[56] References Cited

U.S. PATENT DOCUMENTS 5,170,417  12/1992  Winter ...................................... 327/261
5,532,632   7/1996  Kent ........................................ 327/261

Primary Examiner—Terry D. Cunningham
Assistant Examiner—Eunja Shin
Attorney, Agent, or Firm—Smith-Hill and Bedell

[57] ABSTRACT

A delay line formed by a set of series-connected logic gates produces a sequence of output pulses in delayed response to a sequence of input pulses. The delay provided by a delay line changes with the frequency of its input pulse sequence because of temperature change in the gates due to changing power usage. Therefore a pulse stuffing circuit is provided to monitor the sequence of input pulses supplied to the delay line and to generate one or more stuff pulses when a period between successive input pulses exceeds a target maximum period. Each stuff pulse is sent as an additional input pulse to the delay circuit to decrease the period between input signal pulses. Although the delay circuit adds extra pulses to its output pulse sequence in response to the stuff pulses, the pulse stuffing circuit includes a gating circuit for removing those extra pulses from the output pulse sequence.

9 Claims, 2 Drawing Sheets

PULSE STUFFING CIRCUIT FOR PROGRAMMABLE DELAY LINE

BACKGROUND OF THE INVENTION

1. Field of the Invention

The present invention relates in general to programmable delay lines and in particular to a pulse stuffing circuit for supplying additional input pulses to a delay line as necessary to maintain the delay line at minimum operating temperature.

2. Description of Related Art

A tapped delay line consists of a set of logic gates connected in series so that an input signal applied to the first gate of the series passes through each gate in succession. The output of each gate constitutes a separate output tap of the delay line, with the input signal appearing at each tap in succession. A delay between the appearance of the input signal at any one tap and a next succeeding tap of the delay line is determined by the switching speed of the gate linking the two taps. When the delay line taps drive separate inputs of a multiplexer, the tapped delay line and the multiplexer together form a programmable delay line. Programming data supplied to a control input of the multiplexer tells the multiplexer to select one of the delay line taps and to deliver the signal appearing on the selected delay line tap as a multiplexer output signal. The delay provided by the programmable delay line, the delay between the delay line input and the multiplexer output, is a function of the number of intervening gates the input signal passes through on its way to the selected tap. In particular, the total delay is equal to the sum of delays of the intervening gates and the delay provided by the multiplexer.

It is desirable that the delay provided by the delay line be a constant, predictable value for each tap selection. One source of variation in delay is variation in the frequency of the input signal being delayed. On the leading edge of an input signal pulse, a delay line gate turns on and begins supplying an output pulse to the input of the next gate of the delay line. On the trailing edge of the input signal pulse the gate turns off, thereby terminating the output pulse supplied to the next gate. For CMOS and similar technologies, since the gate generates heat during state transitions, it generates less heat at lower input signal frequencies than at higher input signal frequencies because it transitions less frequently. The delay of each gate of the delay line is determined by the rate at which it can transition from one state to the other. As a gate cools it is able to transition between states more rapidly, thereby decreasing its delay. Thus as the input signal frequency decreases, the delay provided by each gate of the delay line decreases, thereby decreasing the total delay of the delay line.

Some prior art systems sense the temperature of an integrated circuit forming a delay line and control a heater attached to the integrated circuit so as to maintain the integrated circuit at a constant temperature. This method is expensive to implement and is slow to correct for rapid, small swings in temperature that result from abrupt changes in input signal frequency. Other prior art systems sense the switching speeds of representative gates formed on the same integrated circuit as the delay line. Such systems control the integrated circuit power supply level so as to maintain the switching speed of the representative gates constant despite changes in integrated circuit temperature. Since the gates of the delay line use the same power supply, the switching speeds of these gates are also held constant despite changes in their temperature. This method works well but is also expensive to implement.

What is needed is an effective and inexpensive system for eliminating variation in delay of a programmable delay circuit arising from variations in frequency of the signal being delayed.

SUMMARY OF THE INVENTION

A delay line formed by a set of series-connected logic gates produces a sequence of OUTPUT pulses in delayed response to a sequence of INPUT pulses. The delay provided by the delay line changes with the frequency of the INPUT pulse sequence. In accordance with the present invention, a pulse stuffing circuit monitors the sequence of INPUT pulses supplied to the delay line and generates one or more STUFF pulses when a period between successive INPUT pulses exceeds a target maximum period. Each STUFF pulse is sent as an additional INPUT pulse to the delay circuit to decrease the period between INPUT signal pulses. Although the delay circuit adds extra pulses to the OUTPUT pulse sequence in response to the STUFF pulses, the pulse stuffing circuit includes a gating circuit for removing those extra pulses from the OUTPUT pulse sequence.

It is accordingly an object of the invention to provide a system for eliminating variation in delay of a programmable delay circuit arising from variations in frequency of the input signal being delayed.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates in block diagram form a prior art programmable delay line,

FIG. 2 illustrates in block diagram form a pulse stuffing programmable delay circuit in accordance with the present invention, FIG. 3 is a timing diagram illustrating operation of delay circuit of FIG. 2, FIG. 4 illustrates in block diagram form a pulse stuffing delay circuit in accordance with an alternative embodiment of the invention, and FIGS. 5 and 6 are timing diagrams illustrating operation of the delay circuit of FIG. 4.

DESCRIPTION OF THE PREFERRED EMBODIMENT(S)

Figure 1:
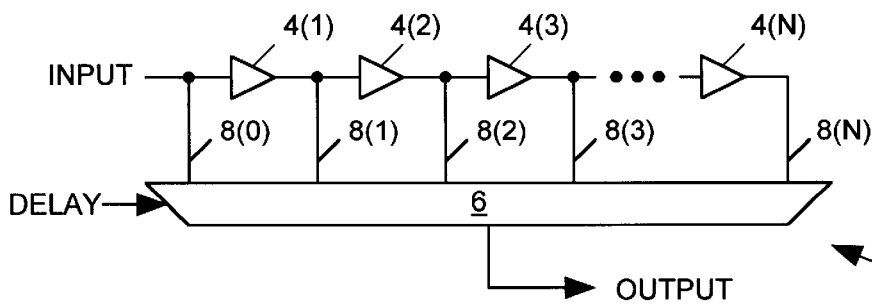

FIG. 1 illustrates a prior art programmable delay line 2 for delaying a sequence of INPUT signal pulses to produce a sequence of OUTPUT signal pulses after a delay controlled by input data DELAY. Delay line 2 includes a set of (N) series-connected logic gates 4(1)–4(N) driven by the INPUT signal and a multiplexer 6 controlled by the input data (DELAY). The INPUT signal and output signals produced by gates 4(1)–4(N) are provided as tap signals 8(0)–8(N) to separate inputs of multiplexer 6. Multiplexer 6 selects one of the tap signals 8(0)–8(N) in response to the input DELAY data and delivers the selected tap signal as its output signal OUT.

The nth gate 4(n) produces an output tap signal 8(n) pulse in response to an input signal pulse with a delay that is determined by the switching delay of the transistors that form the gate. Since transistor switching delay tends to decrease when the temperature falls below a target operating temperature, particularly for CMOS transistors, the delay provided by programmable delay line 2 decreases with its temperature. In order to ensure that its delay remains constant and predictable for each value of DELAY data it is therefore helpful to keep delay line 2 from falling below the target operating temperature.

The INPUT signal can have a variable frequency but variation INPUT signal frequency can cause variation in temperature of delay line 2. As an INPUT signal pulse passes through gates 4(1)–4(N) it causes the gates to generate heat that contributes to the operating temperature of the delay line. When the period between pulses of the INPUT signal increases, gates 4(1)–4(N) fall below the target operating temperature and begin to switch more quickly, thereby decreasing the delay time of programmable delay line 2.

In accordance with the present invention, when the period between delay line input signal pulses becomes too long (for example longer than a target period of 48 nsec), an extra INPUT signal pulse is sent to ("stuffed into") the delay line to make sure that the delay line remains sufficiently warm. OUTPUT pulses the delay line produces in response to the extra INPUT pulse are thereafter removed from the delay line's OUTPUT pulse sequence.

Figure 2:
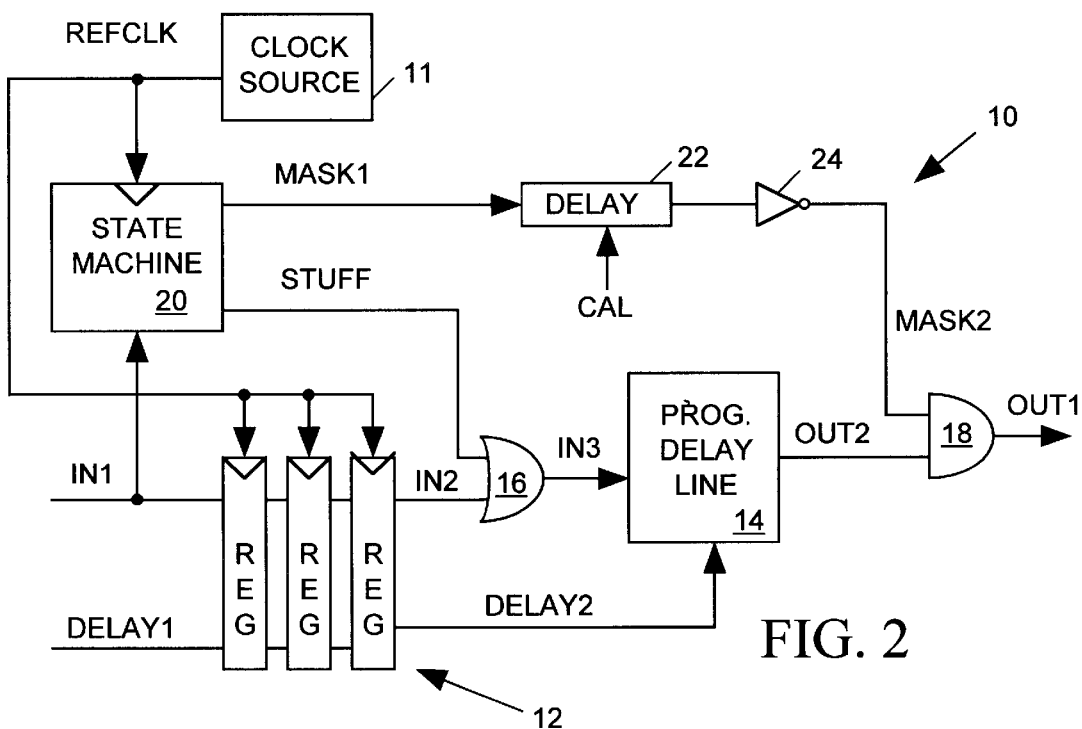

FIG. 2 illustrates a "pulse stuffing" programmable delay circuit 10 in accordance with the present invention. Delay circuit 10, employing a programmable delay line 14 similar to delay line 2 of FIG. 1, delays an input signal IN1 by a delay time determined by input data DELAY1 to produce an output pulse sequence OUT1. The input signal IN1, having pulses synchronized to pulses of a periodic reference clock signal REFCLK produced by a clock source 11, passes through a three-stage register pipeline 12 clocked by the REFCLK signal to become a signal IN2. The IN2 signal, which lags the IN1 signal by twice the period $P_{REF}$ of the REFCLK signal, drives an input of an OR gate 16. OR gate 16 produces an output signal IN3 supplied as input to the programmable delay line 14. Delay line 14 delays IN3 to produce an output signal OUT2. The OUT2 signal drives an input of an AND gate 18 which produces the delay circuit output signal OUT1. An input data value DELAY1, supplied with each IN1 signal pulse by the external source of the IN1 signal, is also clocked through register pipeline 12 to become a data value DELAY2 supplied to a control input of delay line 14. The DELAY2 value controls the delay $D_{PD}$ of programmable delay line 14.

Thus, not counting the small inherent delays of OR gate 16 and AND gate 18, the total delay $D_T$ between IN1 and OUT1 is $$D_T = 2 * P_{REF} + D_{PD}$$

Since $P_{REF}$ is a constant, and since $D_{PD}$ is a function of the value of the DELAY1 data supplied with the IN1 input pulse, then the total delay $D_T$ is determined by the value of DELAY1.

Delay circuit 10 also includes a state machine 20 clocked by the REFCLK signal. State machine 20 monitors the IN1 signal. After detecting an IN1 signal pulse, state machine 20 waits for a fixed period of time (for example 48 nsec) and, if it does not detect a next IN1 signal pulse, state machine 20 transmits an output pulse STUFF to a second input of OR gate 16. OR gate 16 responds by inserting an additional pulse into the IN3 input signal sent to delay line 14. Delay line 14 then delays the IN3 pulse to produce an additional pulse in the OUT2 delay line output signal. State machine 20 continues to generate STUFF pulses every 48 nsecs until it detects a next IN1 pulse. Thus state machine 20 ensures that the minimum period between successive IN3 pulses is, for example, 48 nsec. This keeps delay line 14 from cooling when the period between IN1 pulses is too long. Of course the OUT2 signal produced by delay line 14 will contain extra pulses resulting from the STUFF signal pulses which should not be included in the delay circuit output signal OUT1. However AND gate 18 removes these extra pulses from the OUT2 sequence when producing the desired OUT1 sequence.

When it generates the STUFF pulse, state machine 20 also generates an output MASK1 pulse which, delayed by a delay circuit 22 and inverted by an inverter 24 becomes a MASK2 signal pulse driving another input of AND gate 18. The MASK2 signal is normally high enabling AND gate 18 to produce an OUT1 pulse in response to each input OUT2 pulse. However when state machine 20 generates a MASK1 pulse, inverter 24 thereafter pulls MASK2 low, thereby disabling AND gate 18 until after delay line 14 has generated an output OUT2 pulse in response to its input STUFF pulse. This prevents AND gate 18 from generating an OUT1 pulse in response to an OUT2 pulse resulting from a STUFF pulse. State machine 20 continues to generate STUFF and MASK1 signal pulses every 48 nsec after detecting an IN1 pulse until it detects a next IN1 signal pulse. This ensures that an IN3 pulse is sent to delay line 14, for example, at least every 48 nsec to prevent delay line 14 from cooling.

Figure 3:
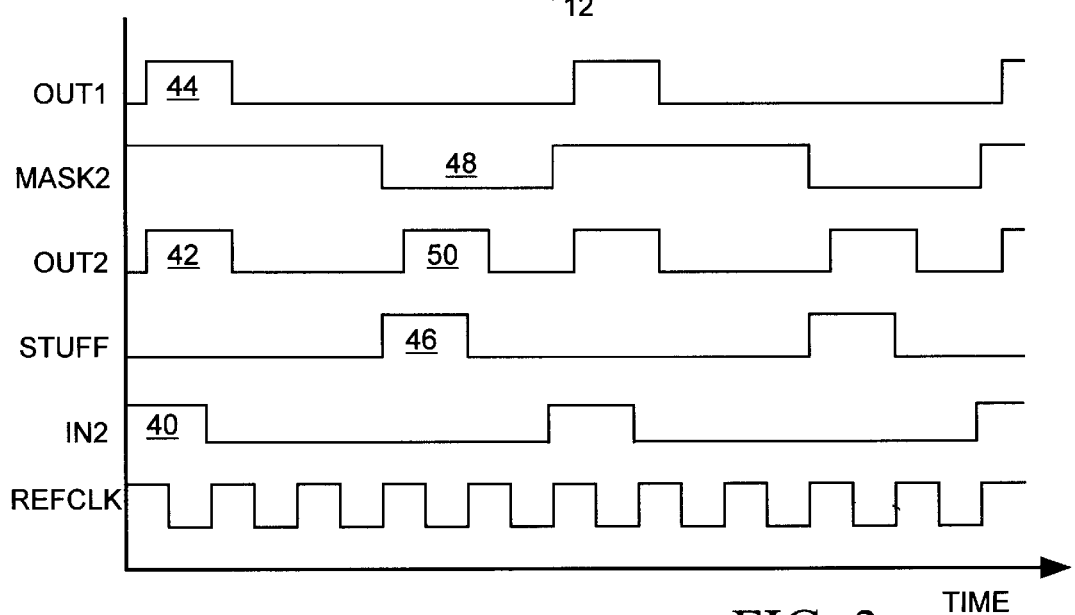

FIG. 3 is a timing diagram illustrating operation of delay circuit 10 of FIG. 2 in an example case wherein IN2 signal pulses are spaced 80 nsecs apart, wherein REFCLK has a 16 nsec period, and wherein the maximum desired period between IN3 pulses is 48 nsec. A first IN2 pulse 40 triggers a delayed OUT2 pulse 42 which in turn triggers a first OUT1 pulse 44 shortly thereafter. Then 48 nsec later, having not detected another IN2 pulse, state machine 20 produces a STUFF pulse 46 and triggers a MASK2 pulse 48. The STUFF pulse 46 triggers an OUT2 pulse 50, but the MASK2 pulse 48 inhibits AND gate 18 from generating an OUT1 pulse in response to OUT2 pulse 50.

In the example of FIG. 3, it was assumed that delay line 14 has an adjustable delay range of 0–16 nsec and that the STUFF and IN2 pulses have 16 nsec periods and 8 nsec pulse widths. In this example, the pulse width of the MASK2 signal is 32 nsec, the sum of the delay range of delay line 14 and the pulse width of the STUFF signal. Delay circuit 22, having a small delay programmed by input calibration data CAL, is provided to finely adjust the timing of the MASK2 pulse so that its leading edge appears with the leading edge of the OUT2 signal when delay line 14 provides minimum delay and so that its trailing edge appears with the trailing edge of the OUT2 signal when delay line 14 provides maximum delay. Thus the MASK2 signal pulse is sized and timed to ensure that AND gate 18 completely blocks an OUT2 signal produced in response to a STUFF signal pulse regardless of the delay currently provided by delay line 14, and to ensure that MASK2 does not block an OUT2 pulse produced in response to an IN2 pulse. Register pipeline 12 provides a 32 nsec delay to ensure that no IN2 pulses enter delay line 14 while the MASK2 signal is blocking OUT2.

Figure 4:
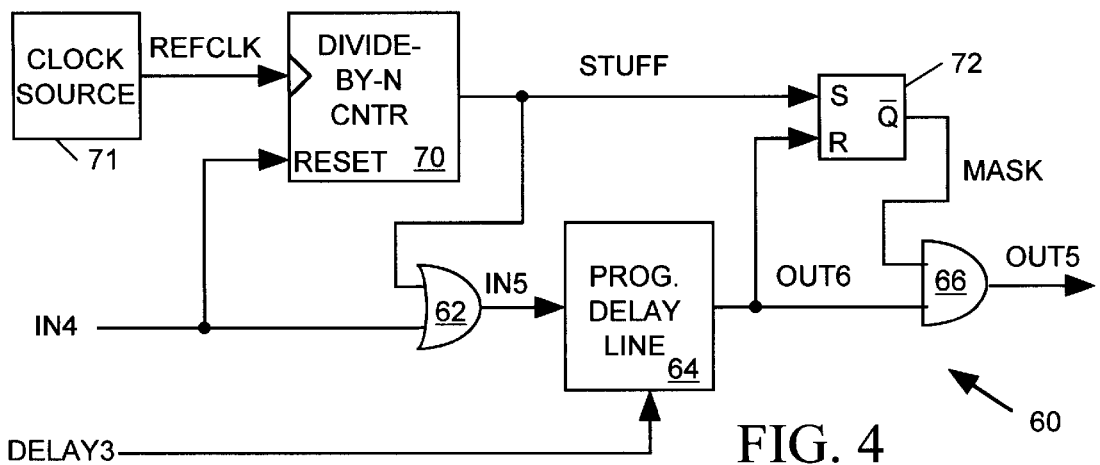

FIG. 4 depicts another pulse stuffing delay circuit 60, an alternative embodiment of the invention. Delay circuit 60 delays an input signal IN4, synchronized to a reference clock signal REFCLK produced by clock source 71, to produce an output signal OUT5 with a delay determined by input delay data DELAY3. A STUFF signal and the IN4 signal drive inputs of an OR gate 62. The output signal IN5 produced by OR gate 62 is supplied to a programmable delay line 64 controlled by input DELAY3 data. Delay line 64 is similar to delay line 2 of FIG. 1. Delay line 64 delays the IN5 signal to produce an OUT6 signal. An AND gate 66 delivers the OUT6 signal as the delay circuit 60 output signal OUT5 when enabled by an input MASK signal but otherwise blocks the OUT6 signal. The IN4 signal drives a reset input of a divide by N counter 70 clocked by the REFCLK signal. Counter 70 produces the STUFF signal pulse that drives an input of OR gate 62 and also drives a set input of a flip-flop 72. The OUT6 signal drives a reset input of flip-flop 72. The leading edge of the STUFF signal drives a MASK2 signal produced at inverting Q output of flip-flop 72 low while the trailing edge of the OUT6 signal drives the MASK signal high. When the MASK signal is high, AND gate 66 passes the OUT6 outward as the OUT5 signal. When the MASK signal is low, AND gate 66 blocks the OUT6 signal. Thus AND gate 66 blocks any OUT2 pulse arising from a STUFF pulse.

Figure 5:
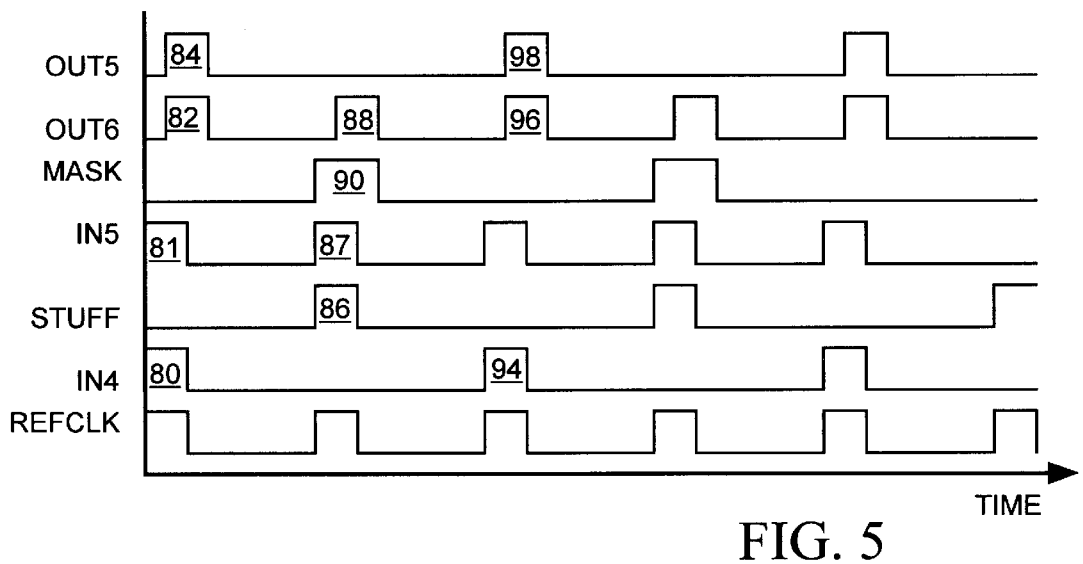

FIG. 5 illustrates timing of various signals in delay circuit 60 for an example in which the value of N for divide by N counter 70 is 1 and delay line 64 is set for a small delay. In this example the period between successive IN4 signal pulses is twice that of REFCLK. Arriving with a first REFCLK pulse, a first IN4 pulse 80 triggers an IN5 pulse 81 which in turn triggers an OUT6 pulse 82 a short time later. And gate 66, passes the OUT6 pulse 82 to the delay circuit output as an OUT5 pulse 84. On a next REFCLK pulse, not being reset by an IN4 pulse, counter 70 sends a STUFF pulse 86 to OR gate 62 and flip-flop 72. STUFF pulse 86 triggers an IN5 pulse 87 which emerges from delay line 64 a short time later as an OUT6 pulse 88. In the meantime, the leading edge of STUFF pulse 86 sets flip-flop 72 to produce a leading edge of a MASK signal pulse 90. The MASK signal pulse 90 blocks the OUT6 pulse. The trailing edge of OUT6 pulse 88 resets flip-flop 72 to produce the trailing edge of MASK pulse 90. Thereafter, a next IN4 pulse 94 arriving with a third pulse of the REFCLK signal, results in an OUT6 pulse 96 that is not blocked. Thus the OUT6 pulse 96 becomes an OUT5 pulse 98.

Figure 6:
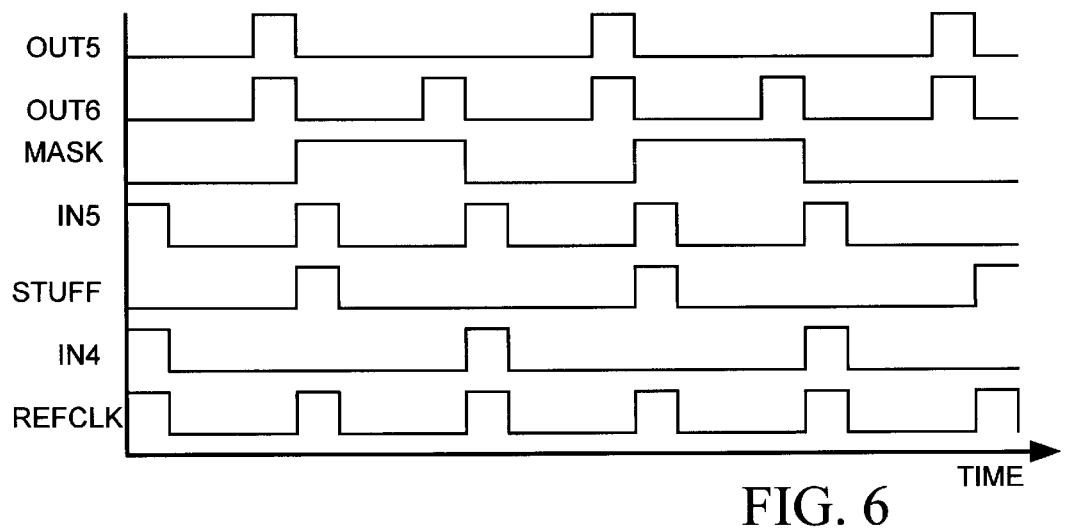

FIG. 6 illustrates timing relations between signals of FIG. 4 under conditions similar to the example of FIG. 5 except that the delay of delay line 64 is set to the high end of its range. In this example, the lag between IN4 and STUFF signals and the OUT6 signals they trigger is greater and the MASK signal pulses are longer.

As may be understood by inspection of FIGS. 5 and 6, an IN5 pulse passes through programmable delay line 64 after each REFCLK signal pulse regardless of whether an IN4 pulse arrives with that REFCLK signal pulse. Since the duty cycle of transistors forming gates of delay line 64 is held constant regardless of the period between pulses of the IN4 signal, the amount of heat produced by delay line 64 remains constant. Thus variation in period between IN4 pulses does not produce a change in temperature of delay line 64 and will therefore not produce a variation in the delay provided by delay line 64.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A pulse-stuffing delay circuit for delaying a sequence of input pulses (IN1) to produce a sequence of output pulses (OUT1), the delay circuit comprising:

pulse generating means (11,20) for receiving said sequence of input pulses (IN1) and for generating at least one STUFF pulse whenever a period between successive input pulses exceeds a minimum period;

means (16) for combining said sequence of input pulses with each STUFF pulse produced by said pulse generating means to produce a combined pulse sequence (IN2);

delay means (14) for delaying said combined pulse sequence (IN2) to produce a delayed combined pulse sequence (OUT2) including delayed input pulses (42) and delayed STUFF pulses (50); and gating means (18,22,24) for removing said delayed STUFF pulses from said delayed combined pulse sequence (OUT2) thereby to produce said sequence of output pulses (OUT1).

2. The pulse-stuffing delay circuit in accordance with claim 1 wherein said delay means comprises at least one logic gate, wherein a delay provided by said delay means is influenced by a switching speed of said logic gate, and wherein the switching speed of the logic gate is influenced by a temperature of said logic gate, and wherein the temperature of said logic gate is influenced by a duration of a period between successive pulses of said combined pulse sequence (OUT2).

3. The pulse-stuffing delay circuit of claim 1 wherein said pulse generating means comprises:

means (11) for generating a sequence of reference signal pulses (REFCLK);

means (20) for receiving said sequence of input pulses (IN1), for receiving said sequence of reference signal pulses (REFCLK) and for generating said at least one STUFF pulse when a number of said reference signal pulses (REFCLK) occurring between successive input pulses (IN1) exceeds a minimum.

4. A pulse-stuffing delay circuit for delaying a sequence of input pulses (IN1) to produce a sequence of output pulses (OUT1), the delay circuit comprising:

means (11) for generating a sequence of reference signal pulses (REFCLK);

means (20) for receiving said sequence of input pulses (IN1), for receiving said sequence of reference signal pulses (REFCLK) and for generating at least one STUFF pulse and at least one MASK pulse whenever a number of said reference signal pulses (REFCLK) occurring between successive input pulses (IN1) exceeds a minimum;

means (16) for combining said sequence of input pulses with each STUFF pulse produced by said means for generating to produce a combined pulse sequence (IN2);

delay means (14) for delaying said combined pulse sequence (IN2) to produce a delayed combined pulse sequence (OUT2) including delayed input pulses (42) and delayed STUFF pulses (50); and gating means (18,22,24) for removing one of said delayed STUFF pulses from said delayed combined pulse sequence (OUT2) in response to each pulse of said MASK signal thereby to produce said sequence of output pulses (OUT1).

5. The pulse-stuffing delay circuit in accordance with claim 4 wherein said delay means comprises at least one logic gate, wherein a delay provided by said delay means is influenced by a switching speed of said logic gate, and wherein the switching speed of the logic gate is influenced by a temperature of said logic gate, and wherein the temperature of said logic gate is influenced by a duration of a period between successive pulses (OUT2) of said combined pulse sequence.

6. A pulse-stuffing delay circuit for delaying a sequence of input pulses (IN4) to produce a sequence of output pulses (OUT5), the delay circuit comprising:

means (71) for generating a sequence of reference signal pulses (REFCLK);

means (70) for receiving said sequence of reference signal pulses (REFCLK) and said sequence of input pulses (IN4) and for generating a STUFF pulse in response to each reference signal pulse (REFCLK) when an input pulse (IN4) does not coincide with said reference signal pulse (REFCLK), each STUFF pulse having a leading edge;

means (62) for combining said sequence of input pulses with each STUFF pulse produced by said means for generating to produce a combined pulse sequence (IN5);

delay means (64) for delaying said combined pulse sequence (IN5) to produce a delayed combined pulse sequence (OUT6) including delayed input pulses (82) and delayed STUFF pulses (80), each pulse (OUT6) having a trailing edge; and gating means (66,72) enabled by the trailing edge of each pulse of said delayed combined pulse sequence (OUT6) and disabled by the leading edge of each STUFF pulse, for providing as output said sequence of output pulses in response to said delayed combined pulse sequence (OUT6) when enabled.

7. The pulse-stuffing delay circuit in accordance with claim 6 wherein said delay means comprises at least one logic gate, wherein a delay provided by said delay means is influenced by a switching speed of said logic gate, and wherein the switching speed of the logic gate is influenced by a temperature of said logic gate, and wherein the temperature of said logic gate is influenced by a duration of a period between successive pulses of said combined pulse sequence (OUT5).

8. A method for operating a delay circuit receiving and delaying a sequence of input signal pulses (IN1) to produce a corresponding sequence of output signal pulses (OUT1) in delayed response thereto, the delay circuit being of the type wherein a delay provided by said delay circuit is influenced by a duration of a period between successive input signal pulses, the method comprising the steps of:

generating a STUFF signal pulse whenever the period between successive input signal pulses (IN1) rises above a predetermined minimum period, combining said sequence of input signal pulses with each STUFF signal pulse produced to produce a combined pulse sequence (IN2), applying the combined pulse sequence (IN2) as an input to the delay circuit such that the delay circuit delays the combined pulse sequence (IN2) to produce a delayed combined pulse sequence including delayed input signal pulses (82) and delayed STUFF signal pulses (80), and removing said delayed STUFF signal pulses from said sequence of delayed combined pulses produced by said delay circuit thereby to produce said sequence of output signal pulses (OUT1).

9. A method for operating a delay circuit receiving and delaying a sequence of input signal pulses (IN4) to produce a corresponding sequence of output signal pulses (OUT6) in delayed response thereto, the delay circuit being of the type wherein a delay provided by said delay circuit is influenced by a duration of a period between successive input signal pulses (IN4), the method comprising the steps of:

generating a sequence of reference signal pulses (REFCLK);

generating a STUFF signal pulse in response to each reference signal pulse (REFCLK) for which no input signal pulse (IN5) occurs concurrently, combining said seguence of input signal pulses with each STUFF signal pulse to produce a combined pulse seguence (IN5);

applying said combined pulse sequence (IN5) as input to the delay circuit such that the delay circuit delays said combined pulse sequence (IN5) to produce a delayed combined pulse sequence (OUT6) including input signal pulses and STUFF signal pulses, and removing STUFF signal pulses from said delayed combined pulse sequence (OUT6) produced by said delay circuit, thereby to produce said seguence of output signal pulses (OUT5).

* * * * *